US008975616B2

(12) United States Patent
Wang et al.

(10) Patent No.: US 8,975,616 B2
(45) Date of Patent: Mar. 10, 2015

(54) QUANTUM EFFICIENCY OF MULTIPLE QUANTUM WELLS

(76) Inventors: Liang Wang, Milpitas, CA (US); Ilyas Mohammed, Santa Clara, CA (US); Masud Beroz, Apex, NC (US)

( * ) Notice: Subject to any disclaimer, the term of this patent is extended or adjusted under 35 U.S.C. 154(b) by 0 days.

(21) Appl. No.: 13/541,559

(22) Filed: Jul. 3, 2012

(65) Prior Publication Data

US 2014/0008607 A1     Jan. 9, 2014

(51) Int. Cl.

| | |
|---|---|
| H01L 29/06 | (2006.01) |
| H01L 31/00 | (2006.01) |
| H01L 33/06 | (2010.01) |
| H01L 31/0352 | (2006.01) |
| H01L 31/105 | (2006.01) |
| H01L 33/24 | (2010.01) |
| H01S 5/20 | (2006.01) |
| H01S 5/34 | (2006.01) |
| H01S 5/343 | (2006.01) |
| H01S 5/32 | (2006.01) |

(52) U.S. Cl.
CPC ........ H01L 33/06 (2013.01); H01L 31/035236 (2013.01); H01L 31/105 (2013.01); H01L 33/24 (2013.01); H01S 5/2009 (2013.01); H01S 5/3407 (2013.01); H01S 5/34333 (2013.01); H01S 5/3205 (2013.01)
USPC .............................................. 257/14; 257/15

(58) Field of Classification Search
USPC .................................................... 257/14, 15
See application file for complete search history.

(56) References Cited

U.S. PATENT DOCUMENTS

| | | | |
|---|---|---|---|
| 5,392,306 A * | 2/1995 | Usami et al. | 372/45.01 |
| 5,463,280 A * | 10/1995 | Johnson | 315/187 |
| 7,556,974 B2 | 7/2009 | Harle et al. | |
| 2004/0056258 A1 * | 3/2004 | Tadatomo et al. | 257/79 |
| 2006/0274801 A1 * | 12/2006 | Tandon et al. | 372/45.01 |
| 2008/0308787 A1 | 12/2008 | Lee et al. | |
| 2009/0045392 A1 | 2/2009 | Park et al. | |
| 2010/0289000 A1 | 11/2010 | Kojima | |
| 2011/0186810 A1 | 8/2011 | Chao et al. | |
| 2011/0187294 A1 * | 8/2011 | Bergmann et al. | 315/363 |
| 2012/0104356 A1 | 5/2012 | Han et al. | |
| 2012/0107991 A1 * | 5/2012 | Huang et al. | 438/47 |

FOREIGN PATENT DOCUMENTS

| | | |
|---|---|---|
| EP | 1729385 A | 12/2006 |
| EP | 2330641 A | 6/2011 |
| JP | 2003031902 A | 1/2003 |
| WO | 0154206 A | 7/2001 |

OTHER PUBLICATIONS

Zukauskas, Arturas; et al.; Solid State Lighting; Wiley (2002); 132 pages.

(Continued)

*Primary Examiner* — Mamadou Diallo
*Assistant Examiner* — Jay C Chang

(57) ABSTRACT

Improved quantum efficiency of multiple quantum wells. In accordance with an embodiment of the present invention, an article of manufacture includes a p side for supplying holes and an n side for supplying electrons. The article of manufacture also includes a plurality of quantum well periods between the p side and the n side, each of the quantum well periods includes a quantum well layer and a barrier layer, with each of the barrier layers having a barrier height. The plurality of quantum well periods include different barrier heights.

18 Claims, 8 Drawing Sheets

(56) References Cited

OTHER PUBLICATIONS

Semiconductor Today Compounds and Advanced Silicon; www.semiconductor-today.com/news_items/2011/OCT/SAIT; Oct. 10, 2011; 3 pages.

CEM Celebi, "Band Formation and Stark Effect in Finite Size Superlattices with Application to Stacked Layers of Graphene", Sep. 30, 2004.

International Search Report and Written Opinion of the International Searching Authority, PCT/US2013/049347, mailed Apr. 3, 2014.

* cited by examiner

QUANTUM EFFICIENCY OF MULTIPLE QUANTUM WELLS

FIELD OF INVENTION

Embodiments of the present invention relate to the field of integrated circuit design and manufacture. More specifically, embodiments of the present invention relate to systems and methods for improved quantum efficiency of multiple quantum wells.

BACKGROUND

Multiple quantum well (MQW) structures are in wide use in light emitting diodes and diode lasers, including visible-wavelength lasers for DVDs and laser pointers, lasers in fiber optic transmitters and blue light emitting diodes, which form the basis of many "white" light emitting diodes. Multiple quantum wells are also used to make HEMTs (High Electron Mobility Transistors), which are used in low-noise electronics. Quantum well infrared photodetectors are also based on quantum wells, and are used for infrared imaging. Further, multiple quantum well structures are utilized in some photovoltaic (solar) cells.

Increased quantum efficiency of such devices is desired.

SUMMARY OF THE INVENTION

Therefore, what is needed are systems and methods for improved quantum efficiency of multiple quantum wells. What is additionally needed are systems and methods for improved quantum efficiency of multiple quantum wells that improve the recombinational efficiency of spatially diverse quantum well structures. A further need exists for systems and methods improved quantum efficiency of multiple quantum wells that are compatible and complementary with existing systems and methods of integrated circuit design, manufacturing and test. Embodiments of the present invention provide these advantages.

In accordance with an embodiment of the present invention, an article of manufacture includes a p side for supplying holes and an n side for supplying electrons. The article of manufacture also includes a plurality of quantum well periods between the p side and the n side, each of the quantum well periods includes a quantum well layer and a barrier layer, with each of the barrier layers having a barrier height. The plurality of quantum well periods include different barrier heights.

In accordance with another embodiment of the present invention, an article of manufacture includes a p side for supplying holes and an n side for supplying electrons. The article of manufacture also includes a plurality of quantum well periods between the p side and the n side, each of the quantum well periods including a quantum well layer and a barrier layer, with each of the barrier layers having a p type doping concentration. The plurality of quantum well periods include barrier layers with different p type doping concentrations.

In accordance with an additional embodiment of the present invention, an article of manufacture includes a multiple quantum well light emitting diode including a plurality of quantum well periods. Each of the quantum well periods includes a quantum well layer and a barrier layer. Each of the quantum well layers includes a quantum well layer thickness and a quantum well layer area. Each of the barrier layers includes a barrier layer thickness, a barrier height, a barrier layer area and a barrier layer p-doping concentration. At least one of the barrier height, the quantum well layer area, and the barrier layer p-type doping concentration vary across the plurality of quantum well periods such that quantum well efficiency is improved in comparison to a device in which the barrier height, the quantum well layer area and the barrier layer p-type doping concentration are constant across the plurality of quantum well periods.

In accordance with a method embodiment of the present invention, a method includes forming a stack of layers for a multiple quantum well semiconductor device on a substrate. The stack of layers includes a p type layer, an electron blocking layer in contact with the p type layer, and a plurality of quantum well periods in contact with the electron blocking layer. Each of the quantum well periods includes a quantum well layer and a barrier layer. The stack of layers also includes an n-type layer in contact with the plurality of quantum well periods. The method further includes etching the stack of layers such that the plurality of quantum well periods include quantum well layers of varying area.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale

DETAILED DESCRIPTION

Figure 1A:
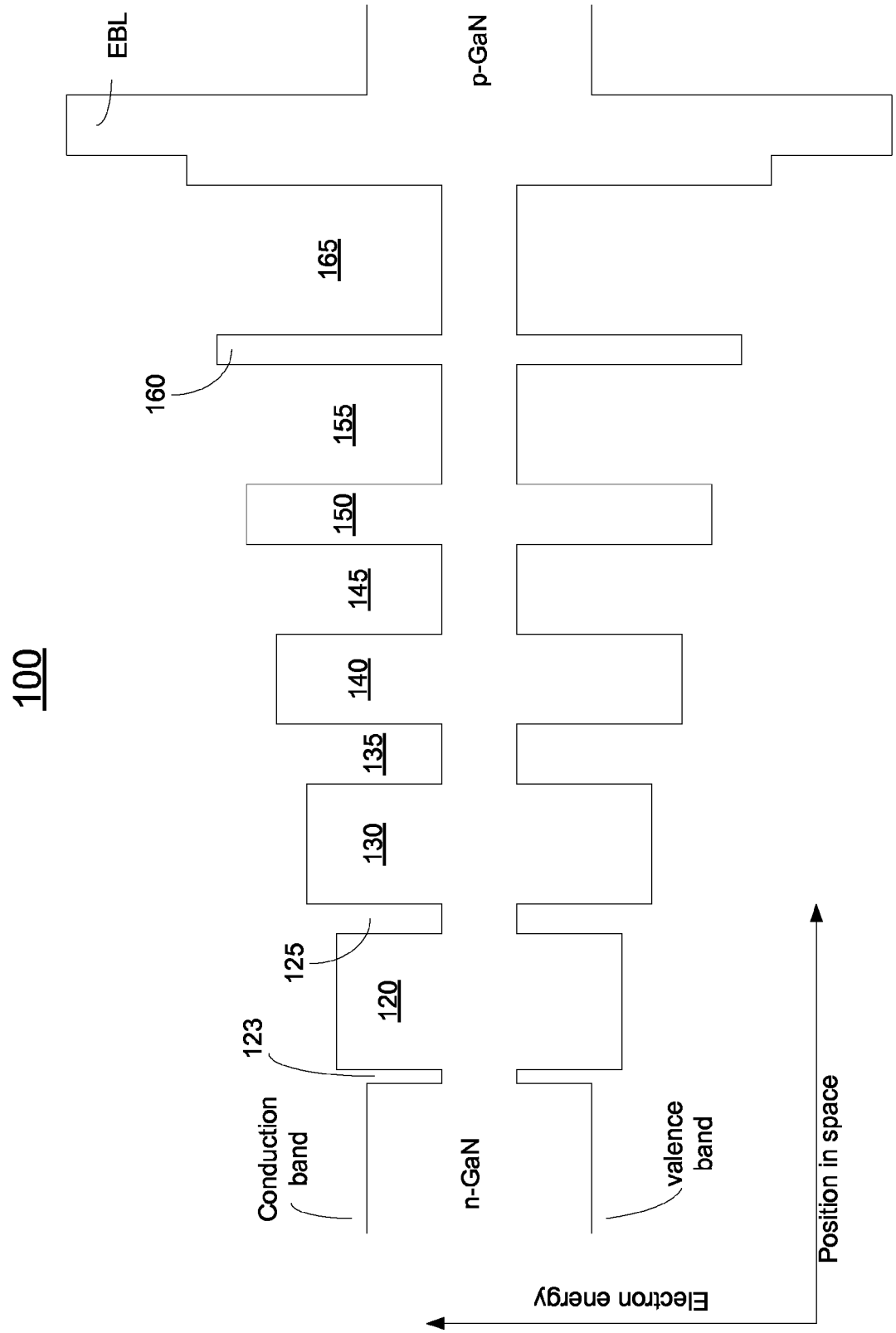
FIG. 1A illustrates an energy band diagram of a light emitting diode, in accordance with embodiments of the present invention.

Reference will now be made in detail to various embodiments of the present invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

Some portions of the detailed descriptions which follow (e.g., process 400 and 401) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "attaching" or "processing" or "singulating" or "processing" or "forming" or "roughening" or "filling" or "accessing" or "performing" or "generating" or "adjusting" or "creating" or "executing" or "continuing" or "indexing" or "processing" or "computing" or "translating" or "calculating" or "determining" or "measuring" or "gathering" or "running" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Although exemplary embodiments in accordance with the present invention are illustrated in terms of a gallium nitride light emitting diode, such examples are not limiting. It is to be appreciated that embodiments in accordance with the present invention are well suited to a variety of devices employing multiple quantum wells, employing a variety of materials.

Improved Quantum Efficiency of Multiple Quantum Wells

In silicon or most III-V compound semiconductors such as gallium arsenide (GaAs), gallium phosphide (GaP) or gallium nitride (GaN), the mobility of holes as charge carriers is less than that of electrons. For example, holes have a larger effective mass than electrons. In addition, for example in a light emitting diode, holes are less efficiently injected through an electron blocking layer (EBL), in comparison with electrons. Thus, there may be many more electrons than holes in an active MQW region, resulting in a charge imbalance.

Accordingly, excessive electrons in an active region may quench "useful" electron-hole pairs which would otherwise contribute to light output through radiative recombination.

Further, electrons may overflow out of a quantum well without contributing to radiative recombination in an active region. Accordingly, excessive and/or leaking electrons detrimentally decrease a device's quantum efficiency at increased current density (known as the "droop" problem), which deters wide adoption of MQW devices in important applications, e.g., area lighting, under the conventional art.

FIG. 1A illustrates an energy band diagram 100 of a light emitting diode, in accordance with embodiments of the present invention. The X dimension indicates position in space, which may be, for example, the distance from a substrate, also known as the direction of growth. The Y dimension indicates electron energy, e.g., measured in electron volts (eV). The light emitting diode comprises a multiple quantum well (MQW). In contrast with the conventional art, the well thickness, barrier layer thickness and/or barrier height, e.g., electron energy of a barrier layer, are not uniform among the plurality of wells.

For example, wells 123, 125, 135, 145, 155 and 165 are characterized as having different thicknesses. Similarly, barrier layers 120, 130, 140, 150 and 160 are characterized as having different thicknesses. In addition, barrier layers 120, 130, 140, 150 and 160 are characterized as having different heights, e.g., different electron energies. In accordance with embodiments of the present invention, well thickness increases from the n layer, e.g., the cathode, to the p layer, e.g., the anode. Similarly, barrier height increases from the n layer, e.g., the cathode, to the p layer, e.g., the anode. It is appreciated that the barrier layer thickness decreases from the n layer, e.g., the cathode, to the p layer, e.g., the anode.

It is appreciated that embodiments in accordance with the present invention are well suited to non-uniformity in one or more aspects of a plurality of quantum wells. For example, in some embodiments, only well thickness may be changed. In other embodiments, only barrier layer thickness may be changed. In still other embodiments, only barrier height may be changed.

Further, embodiments comprising changes to only two aspects of non-uniformity across a plurality of quantum wells are possible. For example, in some embodiments, well thickness and barrier layer thickness may be changed, while barrier height is uniform. In other embodiments, well thickness and barrier height are changed, while well thickness is uniform. In still other embodiments, barrier height and well thickness are changed, while barrier layer thickness is uniform. All such combinations are to be considered embodiments in accordance with the present invention.

The well layers of a multiple quantum well (MQW) region, e.g., of a blue LED, may comprise indium gallium nitride (InGaN). In an exemplary embodiment, the well layers of a plurality of quantum wells may be made of $In_{0.15}Ga_{0.85}N$, which emits a sky blue light with a wavelength peak at 475 nm. A barrier layer in a MQW may comprise GaN, $In_yGa_{(1-y)}N$, $Al_xGa_{(1-x)}N$ or $Al_xIn_yGa_{(1-x-y)}N$. The band gap of the barrier material may be adjusted by controlling its composition (x or y value), which leads to different barrier heights. This may be achieved, e.g., by controlling the mixing ratio of flow rates of the precursor gases into a metal organic chemical vapor deposition (MOCVD) chamber. If the well layer of MQW is made of $In_{0.15}Ga_{0.85}N$, then the barrier material can be chosen as $In_yGa_{(1-y)}N$, where $0<=y<0.15$, leading to different band gap and thus a different barrier height.

In accordance with embodiments of the present invention, a lower barrier height facilitates hole transport through the barrier layer. Accordingly, changing the energy band diagram across a MQW region, e.g., as illustrated in FIG. 1, may make hole and electron distribution more balanced within a MQW, beneficially recombining holes more efficiently with electrons, reducing an excess of electrons, and thus improving quantum efficiency of multiple quantum wells.

Figure 1B:
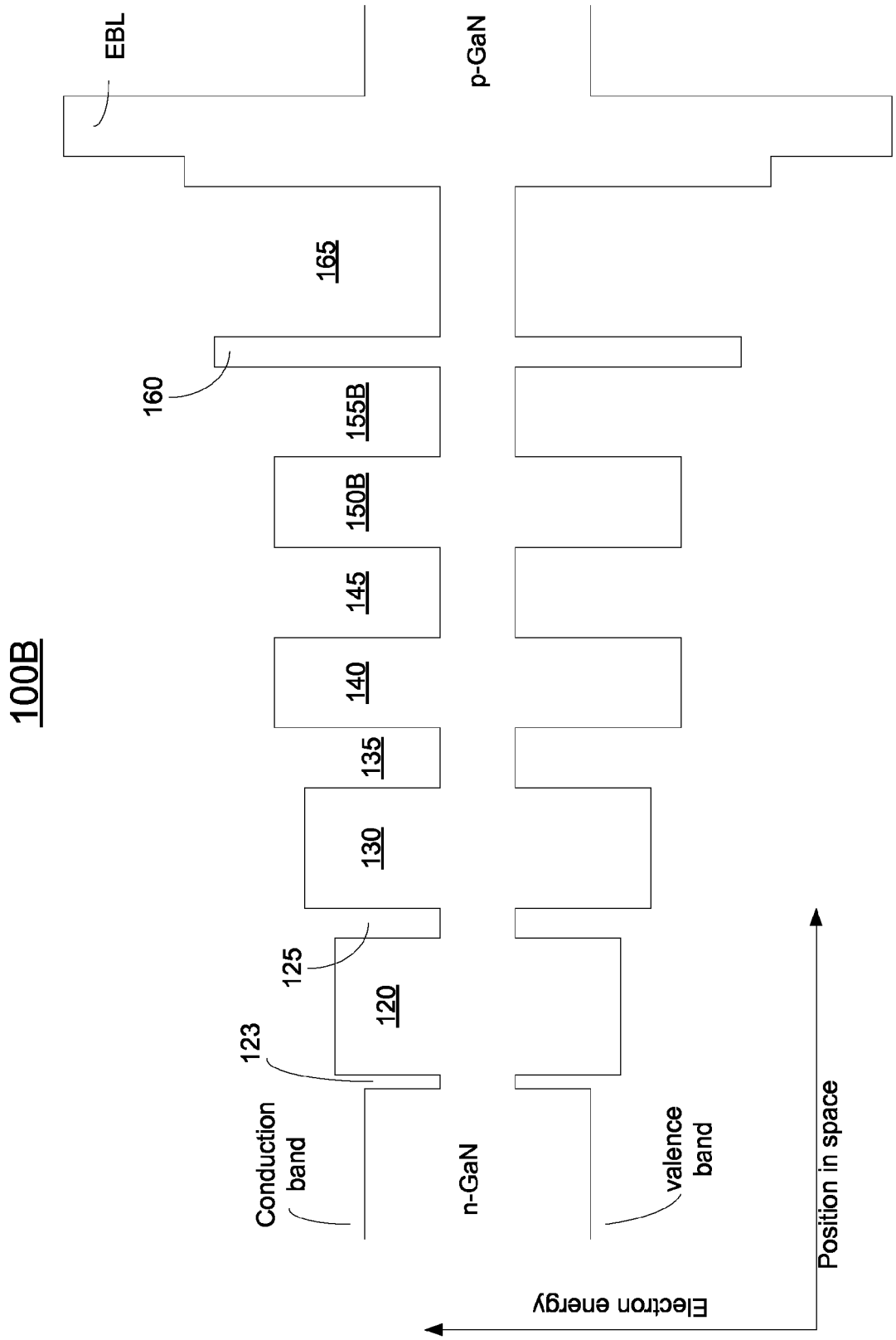
FIG. 1B illustrates a different energy band diagram of a light emitting diode, in accordance with embodiments of the present invention.

It is to be appreciated that not all well layers have to have different thicknesses, not all barrier layers have to have different thicknesses, and not all barrier layers have to have different heights, in accordance with embodiments of the present invention. For example, FIG. 1B illustrates an energy band diagram 100B of a light emitting diode, in accordance with embodiments of the present invention. In comparison with FIG. 1A, FIG. 1B illustrates that not all well thicknesses, barrier thicknesses and barrier heights change in each period of a multiple quantum well structure.

For example, barrier 150B has the same barrier height and thickness as barrier 140, and well 155B has the same thickness as well 145. Even though every period does not change, energy band diagram 100B illustrates that well thickness generally increases from the n layer, e.g., the cathode, to the p layer, e.g., the anode. Similarly, barrier height generally increases from the n layer, e.g., the cathode, to the p layer, e.g., the anode, while the barrier layer thickness generally decreases from the n layer, e.g., the cathode, to the p layer, e.g., the anode.

Figure 2:
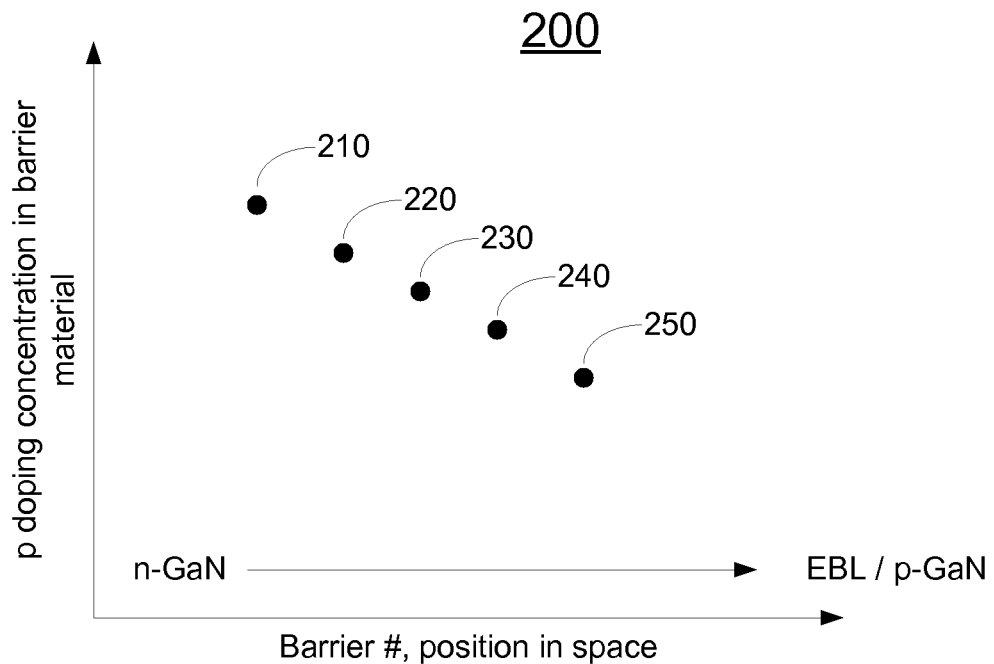
FIG. 2 illustrates an exemplary p-type doping profile for a multiple quantum well (MQW) light emitting diode, in accordance with embodiments of the present invention.

FIG. 2 illustrates an exemplary p-type doping profile 200 for a multiple quantum well (MQW) light emitting diode, in accordance with embodiments of the present invention. A p-doing concentration, e.g., doping with magnesium (Mg), may be varied from one barrier layer to another across a plurality of quantum wells. For example, a first barrier region closest to an n side of a light emitting diode may have a first concentration of p-doping. A next barrier region may have a decreased concentration of p-doping relative to the first barrier region. In general, a p-doing concentration for each successive barrier region, from n side to p side, should decrease. As with the embodiment of FIG. 1A, each barrier region is not required to have a different p type doping concentration.

As illustrated in FIG. 2, a first barrier layer, closest to the n-GaN layer, has an exemplary p-doing concentration 210. A next barrier layer, adjacent to the first barrier layer and farther from the n-GaN layer, has an exemplary p-doping concentration 220. P-doping concentrations 230, 240 and 250 correspond to barrier layers successively farther away from the n-GaN layer. Exemplary p-doping concentration 250 indicates a doping concentration for a barrier closest to the electron barrier layer (EBL) and the p-GaN layer. This may be achieved, e.g., by controlling the mixing concentration of flow rates of the precursor gases into a metal organic chemical vapor deposition (MOCVD) chamber. It is appreciated that the change in p-doping concentration between successive barrier layers need not be consistent or linear, in accordance with embodiments of the present invention.

In accordance with embodiments of the present invention, such non-uniform doping across a multiple quantum well (MQW) region may cause a more uniform distribution of holes across a plurality of quantum wells, beneficially recombining holes more efficiently with electrons, reducing an excess of electrons, and thus improving quantum efficiency of multiple quantum wells.

It is to be appreciated that the novel non-uniform p-doping of an multiple quantum well (MQW) structure illustrated in the exemplary embodiment of FIG. 2 may be applied to an otherwise uniform multiple quantum well region, e.g., a multiple quantum well region in which well thickness, barrier thickness and barrier heights are uniform across the multiple quantum wells. The novel non-uniform p-doping of an otherwise uniform MQW may still improve hole distribution, increase hole and electron recombination, and improve quantum efficiency of an LED, in accordance with embodiments of the present invention.

In accordance with embodiments of the present invention, the embodiments of FIGS. 1A and/or 1B and FIG. 2 may be combined. For example, with reference to both FIGS. 1A and/or 1B and FIG. 2, the p-doping level of barrier layer 120 may be doping level 210, the p-doping level of barrier layer 130 may be doping level 220, and so on.

In accordance with embodiments of the present invention, the non-uniform well and barrier structure, and non-uniform doping profile of a plurality of quantum wells promotes charge balance, e.g., the numbers of holes and electrons are similar. Thus, the efficiency of light emitting diodes in accordance with embodiments of the present invention is increased relative to the convention art devices.

Figure 3:
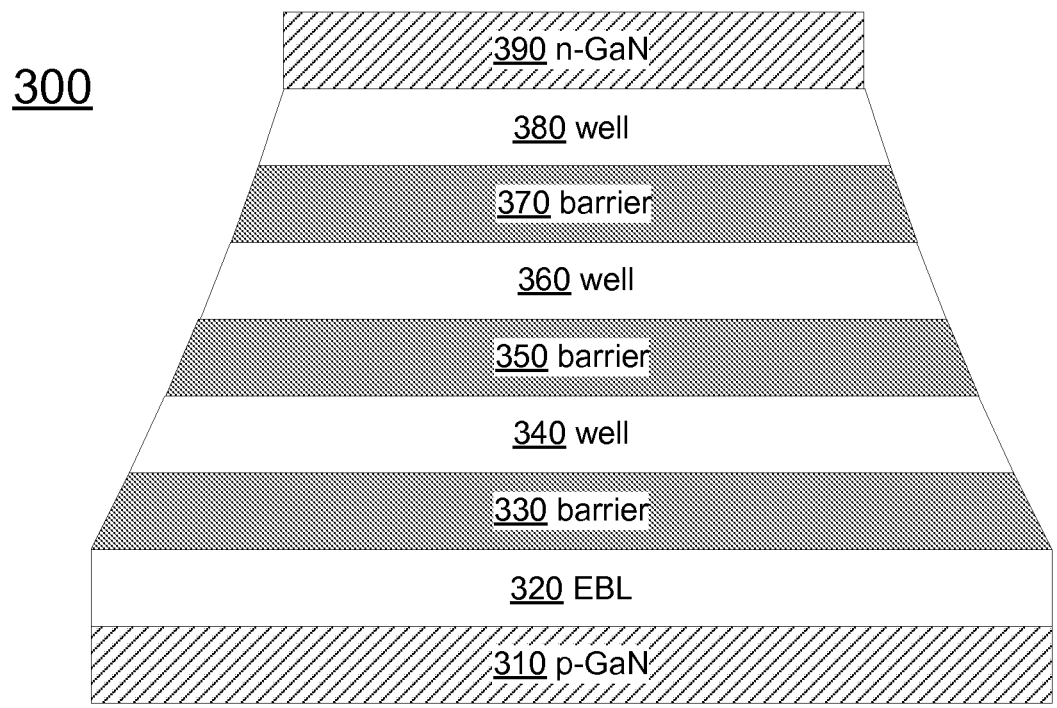
FIG. 3 illustrates a side-sectional view of an exemplary multiple quantum well (MQW) light emitting diode device, in accordance with embodiments of the present invention.

FIG. 3 illustrates a side-sectional view of an exemplary multiple quantum well (MQW) light emitting diode device 300, in accordance with embodiments of the present invention. Layer 310 is a p-GaN layer. Layer 320 is an electron blocking layer (EBL). Layer 390 is an n-GaN layer. Layers 330-380 are three "periods" of multiple quantum wells (MQW). In contrast to the conventional art, the plurality of quantum wells are not uniform. For example, electron blocking layer 320 is wider than barrier 330, barrier 330 is wider than well 340, well 340 is wider than barrier 350, barrier 350 is wider than well 360, well 360 is wider than barrier 370, barrier 370 is wider than well 380 and well 380 is wider than n-GaN layer 390. It is appreciated that embodiments in accordance with the present invention are well suited to more or fewer periods of MQW.

It is appreciated that the edges of the various layers 330-380 need not be straight, and need not be at a constant angle. For example, the edges may be curved. Further, the layers may form a stair step pattern, in which the edges are substantially vertical. Likewise, a barrier and its associated well may have the same horizontal dimensions, and a decrease in width (in the view of FIG. 3) may occur between "periods" of the quantum wells.

In general, the area, e.g., in plan view, of each quantum well layer decreases from the p side to the n side. For example, each quantum well period comprises a barrier layer and a quantum well layer. The area of either or both of a barrier layer and/or a quantum well layer may be varied among periods, in accordance with embodiments of the present invention. It is appreciated that such a relatively larger area towards the p side of the light emitting diode may compensate for the relatively poor transport of holes injected from the p side, and help to achieve a balance of holes and electrons within a plurality of quantum wells, thereby increasing quantum efficiency of the device.

It is to be appreciated that the embodiments of FIGS. 1A and/or 1B and/or FIG. 2 may be combined with embodiments of FIG. 3 in a variety of combinations to further balance holes and electrons within a plurality of quantum wells, thereby increasing quantum efficiency of the device.

Figure 4A:
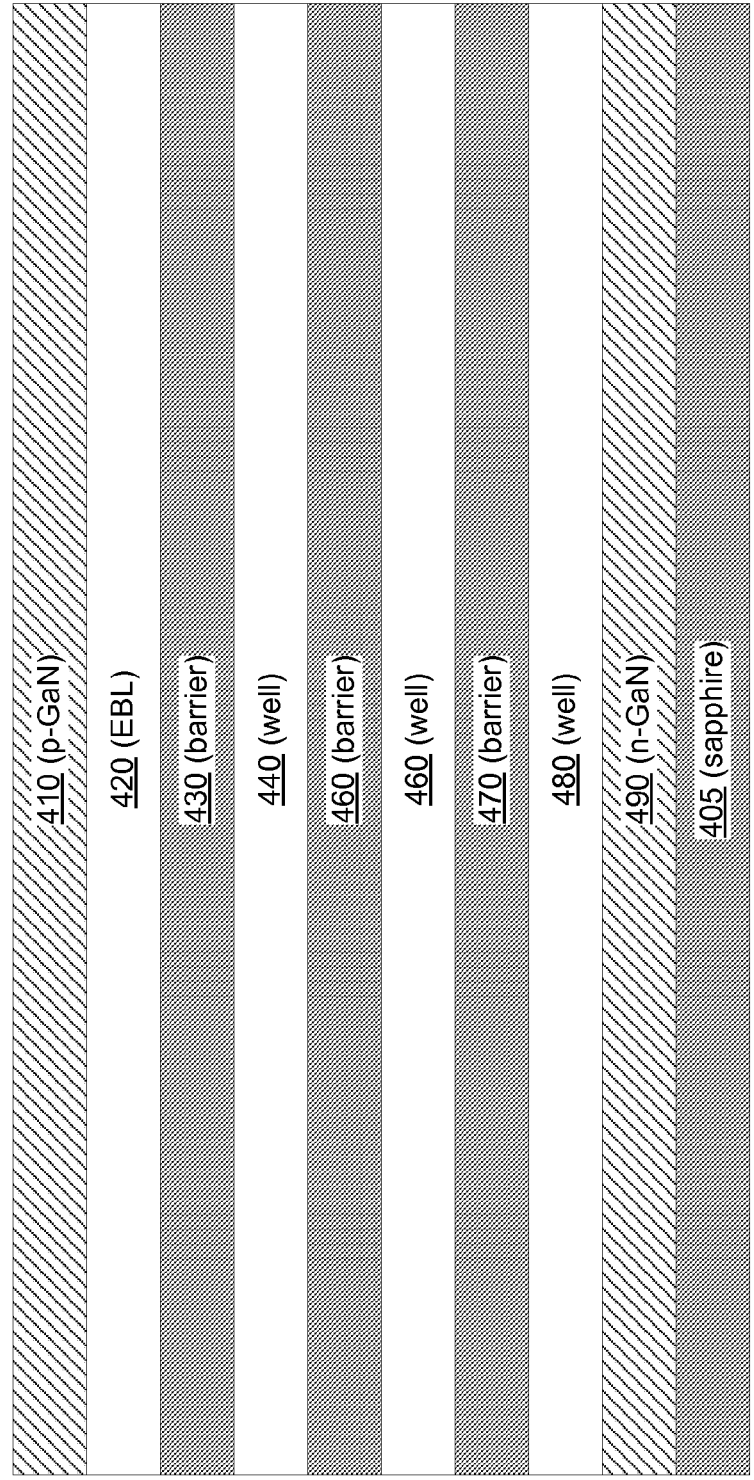
FIGS. 4A and 4B illustrate an exemplary method of forming a multiple quantum well light emitting diode (MQW LED), in accordance with embodiments of the present invention.
Figure 4B:
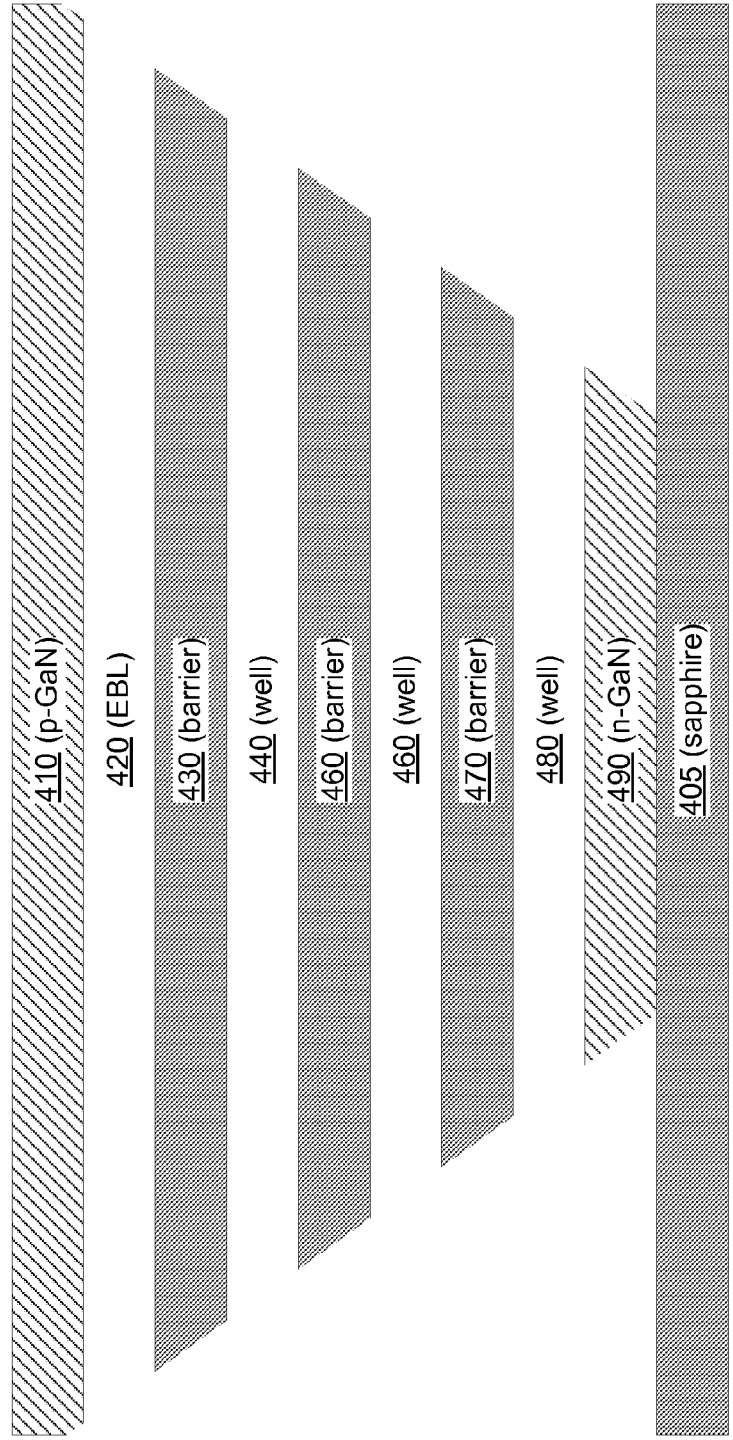

FIGS. 4A and 4B illustrate an exemplary method 400 of forming a multiple quantum well light emitting diode (MQW LED), in accordance with embodiments of the present invention. As illustrated in FIG. 4A, a Gallium nitride (GaN) multiple quantum well (MQW) light emitting diode is formed on a sapphire ($\alpha$-$Al_2O_3$) substrate 405, via any suitable process and materials. For example, an n-type layer 490 of Gallium nitride (GaN) is formed on substrate 405. A three-period multiple quantum well structure 480-430 may be formed on the n-GaN layer 490. Layers 480, 460 and 440 are quantum well layers, and may comprise, for example, indium gallium nitride (InGaN). Layers 470, 450 and 430 are barrier layers, and may comprise, for example, gallium nitride GaN, indium gallium nitride (InGaN), aluminum gallium nitride (AlGaN) or aluminum indium gallium nitride (AlInGaN).

A p-type layer 410 is formed on top of the MQW (480-430). As is typical, the diode structure is formed continuously over substantially all of the sapphire substrate, although this is not required. It is to be appreciated that embodiments in accordance with the present invention are well suited to other types of devices comprising different materials.

In FIG. 4B, portions of the layer stack are removed, in accordance with embodiments of the present invention. The material may be removed in an undercut via any suitable process, for example a wet etch employing alkaline etchants such as potassium hydroxide (KOH), with a controlled concentration of etchant and buffering ions, time and temperature. It is appreciated that the general profile of the layers 410-480 in FIG. 4B generally corresponds to the profile of layers set forth in FIG. 3. For example, the barrier and well layers increase in width—and area, in plan view—from the n side to the p side.

Figure 4C:
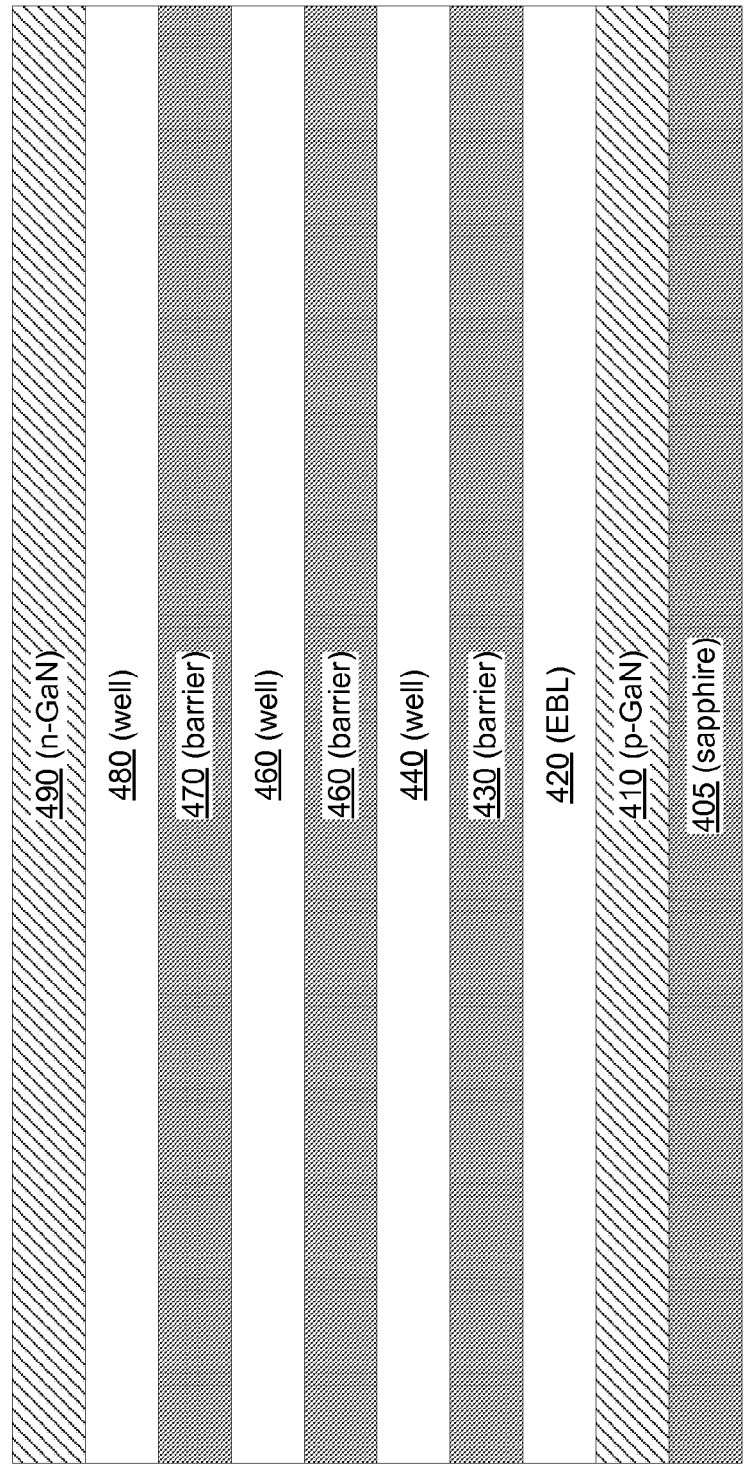
FIGS. 4C and 4D illustrate an exemplary method of forming a multiple quantum well light emitting diode (MQW LED), in accordance with embodiments of the present invention.
Figure 4D:
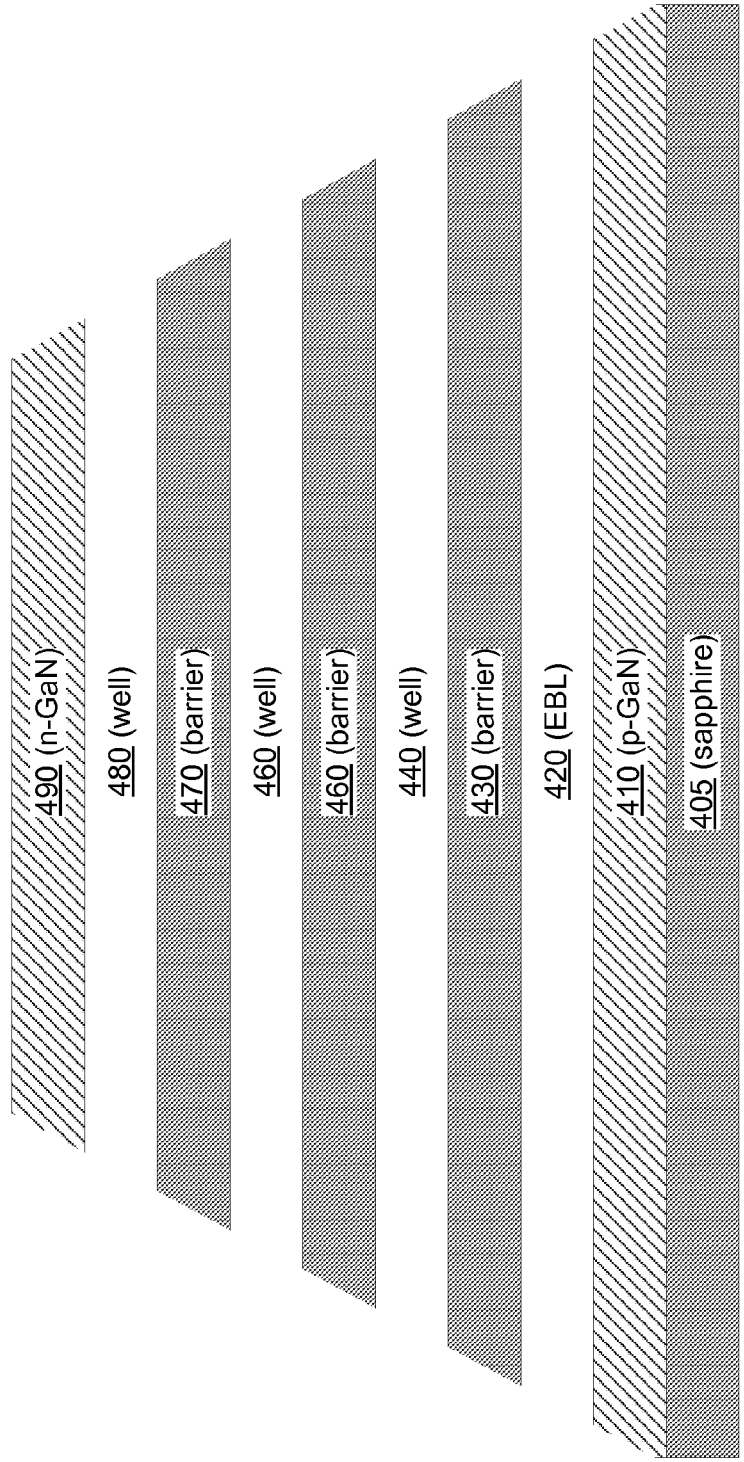

FIGS. 4C and 4D illustrate an exemplary method 401 of forming a multiple quantum well light emitting diode (MQW LED), in accordance with embodiments of the present invention. As illustrated in FIG. 4A, a Gallium nitride (GaN) multiple quantum well (MQW) light emitting diode is formed on a sapphire ($\alpha$-$Al_2O_3$) substrate 405, via any suitable process and materials. In contrast with the embodiment of FIG. 4A, the layers are formed in the opposite order in the embodiment of FIG. 4C. For example, the p-GaN layer 410 is formed adjacent to the sapphire substrate 410, and the n-GaN layer 490 is formed on top of the stack.

In FIG. 4D, portions of the layer stack are removed, in accordance with embodiments of the present invention. The material may be removed via any suitable process. It is appreciated that the general profile of the layers 410-480 in FIG. 4D generally corresponds to the profile of layers set forth in FIG. 3. For example, the barrier and well layers increase in width—and area, in plan view—from the n side to the p side.

While the layer stack of the embodiment of FIGS. 4C and 4D, e.g., with the p side against the substrate, may be less common than the layer stack of the embodiment of FIGS. 4A and 4B, e.g., with the n side against the substrate, it may be advantageous to form the layers as illustrated in FIGS. 4C and 4D, in order to simplify the etching process. For example, it may be more common, straight forward and/or more controllable to etch as illustrated in FIG. 4D than to etch as illustrated in FIG. 4B.

In accordance with another embodiment of the present invention, multiple quantum wells of varying areas may be formed by a process of wet etching after nanoimprint patterning. For example, a low viscosity resist film is pressed with a mold to create a thickness contrast in the resist. The resist is then exposed to UV light, curing it to produce a rigid and durable tightly bonded polymer network that conforms to the mold features. The mold is separated from the polymer film, and the pattern transfer is completed using anisotropic etching to remove residue resist in the compressed troughs.

This nanoimprint lithography process is capable of defining a pattern of nanoscale-size, e.g., less than about 100 nm, islands of resist/polymer serving as etch mask on the top surface of device stack of a single LED. Then the patterned LED wafer may be processed with a wet etch employing alkaline etchants such as potassium hydroxide (KOH) or Tetramethylammonium hydroxide (TMAH), with a controlled concentration of etchant and buffering ions, time and temperature, in order to achieve the desired profile of varying area throughout the thickness of MQW. After wet etching, resist and polymer film are stripped off with organic solvent like acetone or N-Methyl-2-pyrrolidone (NMP) or an oxygen plasma ashing process. The spacing between etched LED islands may be filled with dielectric materials such as $SiO_2$ and planarized to expose the top surface of the LED stack so that a metal contact may be made by nanoimprint/metal deposition/liftoff and/or metal deposition/nanoimprint/etching metal.

Figure 5:
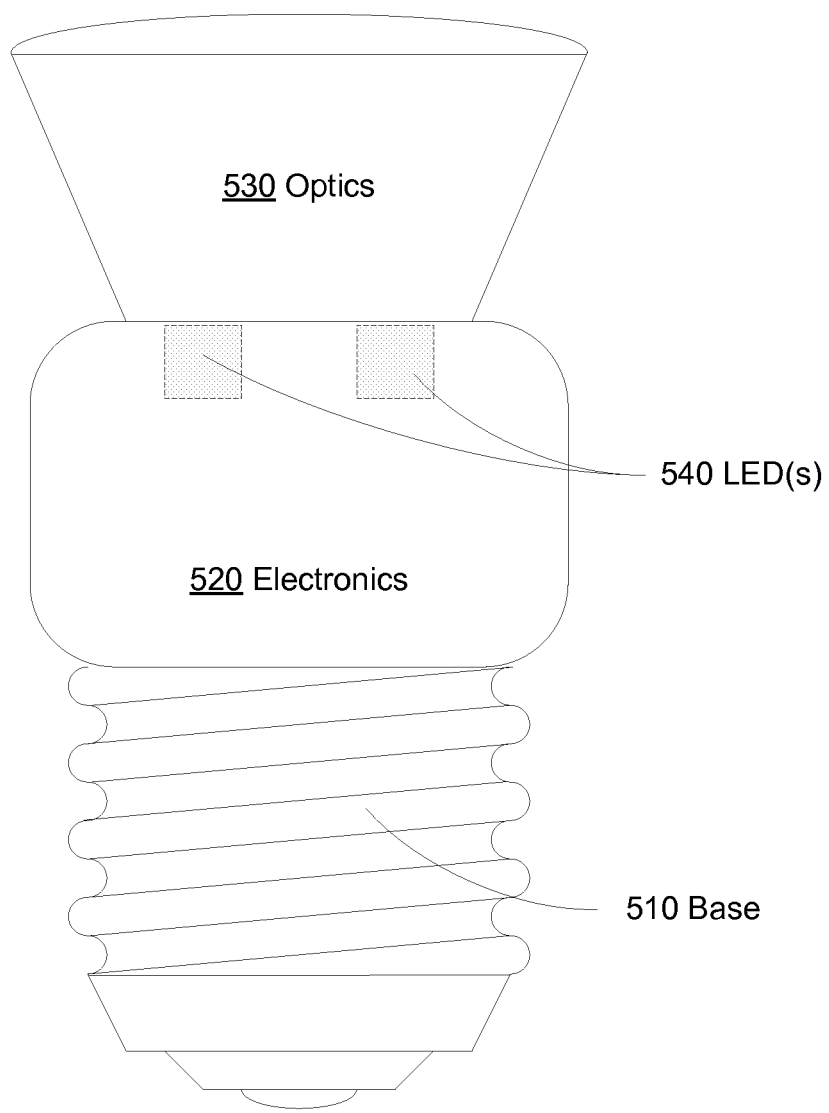
FIG. 5 illustrates an example of an application of multiple quantum well light emitting diodes having improved quantum efficiency, in accordance with embodiments of the present invention.

FIG. 5 illustrates an example of an application of multiple quantum well light emitting diodes having improved quantum efficiency, in accordance with embodiments of the present invention. Light appliance 500 is well suited to a variety of lighting applications, including domestic, industrial, automobile, aircraft and landscape lighting. Light appliance 500 is also well suited to stage or theatrical lighting. Light appliance 500 comprises a base 510. As illustrated, base 510 is an Edison type base. It is appreciated that embodiments in accordance with the present invention are well suited to other types of bases, including, for example, GU, bayonet, bipin, wedge, stage pin or other types of bases.

Light appliance 500 additionally comprises a body portion 520 that houses power conditioning electronics (not shown) that convert 110 V AC input electrical power (or 220 V AC, or other selected input electrical power) to electrical power suitable for driving a plurality of light emitting diode devices 540. Body portion 520 may also comprise, or couple to, optional heat sink features (not shown).

Light appliance 500 may additionally comprise optional optics 530. Optics 530 comprise diffusers and/or lenses for focusing and/or diffusing light from the plurality of light emitting diode devices 540 into a desired pattern.

Light appliance 500 comprises a plurality of light emitting diode devices. Individual LEDs of a plurality of light emitting diode devices may correspond to assemblies previously described herein. For example light appliance 500 may include one or more instances of a multiple quantum well light emitting diode. It is appreciated that not all instances of light emitting diodes need be identical.

It is to be further appreciated that appliance 500 may comprise a plurality of individual, different, LED devices. For example, one instance of an electronic device may be a blue light emitting diode formed on a sapphire substrate. Another instance of an electronic device may be a green light emitting diode formed on a gallium phosphide (GaP) substrate. Another instance of an electronic device may be a red light emitting diode formed on a gallium arsenide (GaAs) substrate. The three instances of electronic devices may be arranged such that the light from such three colors may be combined to produce a variety of spectral colors. For example, a plurality of light emitting diode devices may operate in combination to produce a "white" light output.

In accordance with embodiments of the present invention, device 500 may include additional electronics associated with the LED devices. In one exemplary embodiment, such additional electronics may comprise circuits to implement a white balance among tri-color LEDs.

Embodiments in accordance with the present invention provide systems and methods for improved quantum efficiency of multiple quantum wells. In addition, embodiments in accordance with the present invention provide systems and methods for improved quantum efficiency of multiple quantum wells that improve the recombinational efficiency of spatially diverse quantum well structures. Further, embodiments in accordance with the present invention provide for systems and methods improved quantum efficiency of multiple quantum wells that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. An article of manufacture comprising:
a p side for supplying holes;
an n side for supplying electrons; and
a plurality of quantum well periods between said p side and said n side, each of said quantum well periods comprising a quantum well layer and a barrier layer, each said barrier layer having a barrier height,
wherein said plurality of quantum well periods comprise different barrier heights,
wherein each said barrier layer has a barrier layer p type doping concentration, and wherein said plurality of quantum well periods comprise different barrier layer p type doping concentrations.

2. The article of manufacture of claim 1 wherein said barrier height increases from said n side to said p side.

3. The article of manufacture of claim 1 wherein said barrier height is different in each of said plurality of quantum well periods.

4. The article of manufacture of claim 1 wherein said barrier layer p type doping concentration decreases from said n side to said p side.

5. The article of manufacture of claim 1 wherein said barrier layer p type doping concentration is different in each of said plurality of quantum well periods.

6. The article of manufacture of claim 1 wherein each said quantum well layer has a quantum well layer area, and wherein said plurality of quantum well periods comprise quantum well layer areas.

7. The article of manufacture of claim 6 wherein said quantum well layer area increases from said n side to said p side.

8. The article of manufacture of claim 7 wherein said quantum well layer area is different in each of said plurality of quantum well periods.

9. The article of manufacture of claim 1 wherein each said quantum well layer has a quantum well layer thickness, wherein said plurality of quantum well periods comprise different quantum well layer thicknesses.

10. The article of manufacture of claim 9 wherein said quantum well layer thickness increases from said n side to said p side.

11. The article of manufacture of claim 10 wherein said quantum well layer thickness is different in each of said plurality of quantum well periods.

12. The article of manufacture of claim 1 further comprising: a base for coupling to a source of alternating current; and
electronics for converting said alternating current to direct current suitable for use with a light emitting diode, and wherein said p side, said n side and said plurality of quantum well periods form a portion of said light emitting diode.

13. An article of manufacture comprising:
a multiple quantum well light emitting diode comprising a plurality of quantum well periods;
each of said quantum well periods comprising a quantum well layer and a barrier layer;
each of said quantum well layers comprising a quantum well layer thickness and a quantum well layer area;
each of said barrier layers comprising a barrier layer thickness, a barrier height and a barrier layer p-doping concentration; and wherein at least one of:
said barrier height,
quantum well layer area, and
said barrier layer p-type doping concentration vary across said plurality of quantum well periods such that quantum well efficiency is improved in comparison to a device in which said barrier height, said quantum well layer area and said barrier layer p-type doping concentration are constant across said plurality of quantum well periods, and wherein said barrier height increases from an n side to a p side of said multiple quantum well light emitting diode.

14. The article of manufacture of claim 13 wherein said quantum well layer area increases from an n side to a p side of said multiple quantum well light emitting diode.

15. The article of manufacture of claim 13 wherein said barrier layer p type doping concentration decreases from an n side to a p side of said multiple quantum well light emitting diode.

16. The article of manufacture of claim 13 wherein said quantum well layer thickness increases from an n side to a p side of said multiple quantum well light emitting diode.

17. The article of manufacture of claim 13 wherein said barrier layer thickness decreases from an n side to a p side of said multiple quantum well light emitting diode.

18. The article of manufacture of claim 13 further comprising: a base for coupling to a source of alternating current; and
electronics for converting said alternating current to direct current suitable for use with said multiple quantum well light emitting diode.

* * * * *